United States Patent [19]
Kryter

[11] Patent Number: 4,630,302
[45] Date of Patent: Dec. 16, 1986

[54] HEARING AID METHOD AND APPARATUS
[75] Inventor: Karl D. Kryter, Bodega Bay, Calif.
[73] Assignee: Acousis Company, Bodega Bay, Calif.
[21] Appl. No.: 762,309
[22] Filed: Aug. 2, 1985
[51] Int. Cl.4 .............................................. H04B 1/10
[52] U.S. Cl. ........................................ 381/57; 381/94; 381/106; 381/108; 381/68.4
[58] Field of Search ............... 381/106, 107, 108, 102, 381/57, 71, 72, 68, 94; 179/107 FD, 107 R

[56] References Cited
U.S. PATENT DOCUMENTS

| 3,894,195 | 7/1975 | Kryter | 179/107 FD |
|---|---|---|---|
| 3,920,931 | 11/1975 | Yanick, Jr. | 381/68 |
| 3,934,084 | 1/1976 | Munson | 381/57 |
| 4,068,092 | 1/1978 | Ikoma | 381/94 |
| 4,185,168 | 1/1980 | Graupe | 381/94 |
| 4,216,430 | 8/1980 | Amazawa | 381/94 |
| 4,353,035 | 10/1982 | Schröder | 381/106 |
| 4,398,061 | 8/1983 | McMann | 381/94 |
| 4,405,831 | 9/1983 | Michelson | 381/68 |
| 4,409,435 | 10/1983 | Ono | 381/71 |
| 4,433,435 | 2/1984 | David | 381/94 |
| 4,442,546 | 4/1984 | Ishigaki | 381/94 |
| 4,449,106 | 5/1984 | Ishigaki | 381/106 |
| 4,449,190 | 5/1984 | Flanagan | 381/106 |
| 4,461,025 | 7/1984 | Franklin | 381/94 |
| 4,550,426 | 10/1985 | Gillig | 381/106 |
| 4,558,459 | 12/1985 | Noso | 381/57 |

FOREIGN PATENT DOCUMENTS 1094357 12/1967 United Kingdom .................. 381/57

Primary Examiner—Gene Z. Rubinson
Assistant Examiner—L. C. Schroeder
Attorney, Agent, or Firm—Victor R. Beckman

[57] ABSTRACT

Method and apparatus for aiding hearing are disclosed comprising an automatic gain control unit which includes a first section for increasing the amplitude of input signal segments that are below a threshold level, and a second section for reducing the amplitude of input signal segments that are above said threshold level. Both sections have short attack and long release time constants. A long attack short release time constant noise suppressor unit responsive to the output from the second section and having a threshold level of operation below that of the threshold level of the automatic gain control units passes speech signals and squelches background noise signals between speech signal segments for improved understandability of speech signals.

14 Claims, 2 Drawing Figures

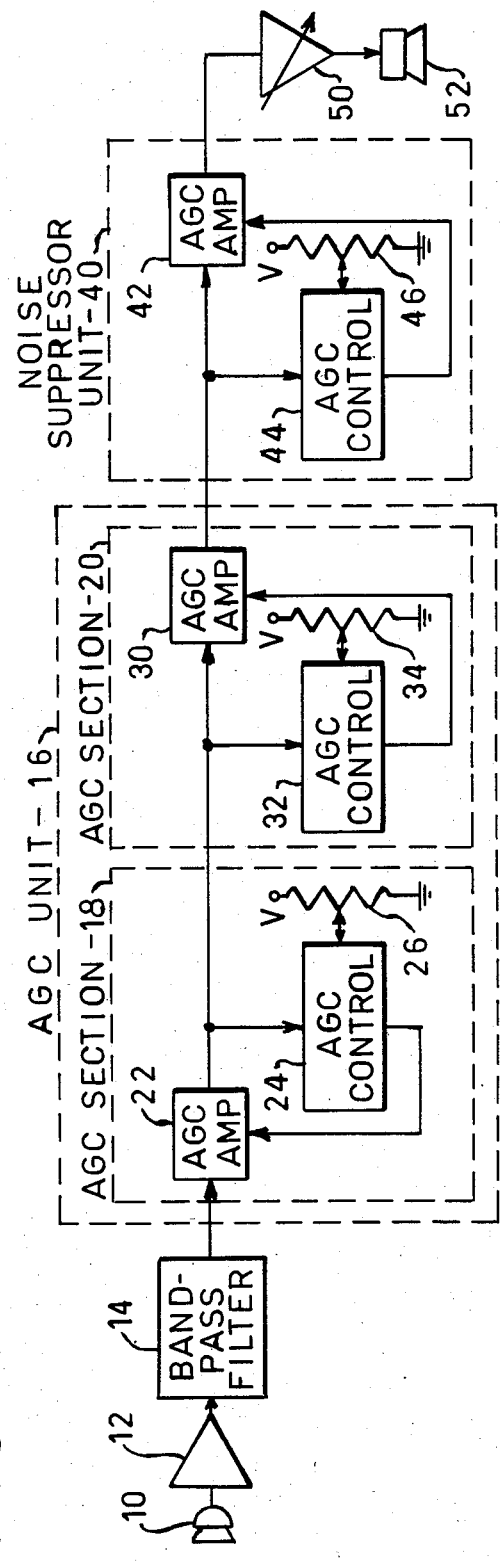
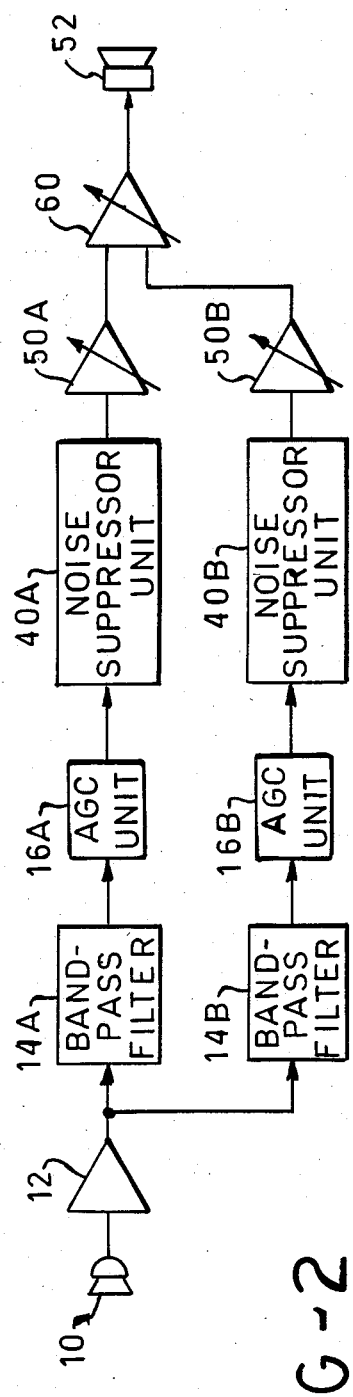
FIG-1
FIG-2

HEARING AID METHOD AND APPARATUS

BACKGROUND OF THE INVENTION

A common complaint made by users of hearing aids is that background noise heard between speech input signals is unpleasantly loud and interferes to some degree with the hearing of segments of speech signals. U.S. Pat. No. 3,894,195 discloses means for providing additional gain to signals which because of their relatively short durations below a prescribed level are identified as speech signals and not low level background noise of relatively long duration. However, there is no squelching of such noise segments between speech signals which continue to interfere with hearing. Squelch circuits which remove or reduce high level noise signals are, of course, well known.

SUMMARY OF THE INVENTION

An object of this invention is the provision of improved hearing aid method and apparatus by means of which speech signals are differentiated from typical low level background noise signals present in or derived from microphone pick-up means and are amplified to a greater degree than the noise signals to prevent temporal masking of speech signals by the presence of said noise signals.

Another object of this invention is the provision of hearing aid method and apparatus of the above-mentioned type which avoids the above and other shortcomings of the prior art.

The above and other objects and advantages of this invention are achieved by use of automatic gain control amplifier means for amplifying the output from one or more microphones in a manner such that speech signal segments are compressed and have a substantially long time (say 0.4 sec) average level. Noise suppressor means responsive to the output from the automatic gain control amplifying means are provided which have a longer attack time constant (of say, 0.4 sec) than recovery time constant (of, say, 0.01 sec). The threshold level of operation of the noise suppressor means is below the long-time average level of the speech signals such that noise signals between speech signal segments are reduced, or squelched, whereas combined background noise and speech signals are passed to the input of output amplifying means for further amplification thereof.

BRIEF DESCRIPTION OF THE DRAWINGS

The invention, together with other objects and advantages thereof, will be better understood from the following description when considered with the accompanying drawings. In the drawings, wherein like reference characters refer to the same parts in the several views:

FIG. 1 is a block diagram of hearing aid apparatus embodying the present invention, and FIG. 2 is a block diagram of a modified form of this invention which includes a plurality of shunt paths for separate noise reduction operation on adjacent frequency bands of the speech signal.

Referring first to FIG. 1, microphone pick-up means comprising one or more microphones converts audible signals to electrical form and, for purposes of illustration, a single microphone 10 is shown. In addition to speech signals, the microphone also picks up background noise signals such as the noise of a crowd, or the like. In the present invention the term background noise signals identifies relatively continuous audible signals of substantially constant amplitude from any source which signals are distinguishable from speech signals which vary over a greater amplitude range within shorter time periods.

The signal output from microphone 10 is amplified by input amplifier 12, and the amplified signal is filtered by band-pass filter 14 which is adapted to pass speech signals in the range of, say, 200 to 6000 Hz. The amplified and filtered signal is supplied to an automatic gain control unit 16 which functions to compress those segments which include speech components to a substantially constant long-time (say, 0.4 sec) average level. Background noise signals between speech signal segments at the output from automatic gain control unit 16 have substantially the same long-time average level as the speech signal segments. For input signals having a relatively narrow amplitude range, unit 16 may comprise a conventional automatic gain control amplifier.

To handle a wide amplitude range of speech signals from a whisper to a shout, the automatic gain control unit 16 illustrated in FIG. 1 may be employed, which includes first and second automatic gain control sections 18 and 20 in series circuit. The first section 18 comprises an automatic gain control amplifier 22 having a signal input from band-pass filter 14 and a control signal input from agc control unit 24. The signal input for control unit 24 is obtained from the automatic gain control amplifier 22 output, and a threshold voltage above which the agc control unit 24 ceases to operate is supplied by voltage source V connected to unit 24 through a potentiometer 26. In this section of automatic gain control unit 16 input signals below a specified level, established by the threshold voltage supplied thereto, are increased to said specified level. For example, for speech sounds at an acoustic sound pressure level (SPL) below, say, 55 dB, the gain of amplifier 22 is increased so as to raise the output level from amplifier 22 to a level equivalent to that of a 55 dB SPL signal to the microphone. With speech input signals above the 55 dB SPL level, automatic gain control control unit 24 ceases to function and input signals are subject to linear amplification by automatic gain control amplifier 22. At these high input signal levels amplifier 22 may have unitary gain. With only background noise signals at the input to the microphone between speech signal segments, the gain of automatic gain control amplifier 22 is increased to raise such noise signals to the 55 dB SPL level.

Second automatic gain control section 20 is used to reduce the signal level of those speech signals that are above the specified 55 dB SPL acoustic input level to the 55 dB level. The illustrated automatic gain control section 20 comprises an automatic gain control amplifier 30 and an agc control unit 32 which are provided with signal inputs from automatic gain control section 18. A threshold voltage above which the automatic gain control control unit 32 operates is provided by voltage source V connected to unit 32 through a potentiometer 34. In this section of automatic gain control unit 16 speech signals to automatic gain control amplifier 30 above the level equivalent to a 55 dB SPL acoustic signal are reduced in amplitude by control of the gain of amplifier 30 such that the speech signal output from amplifier 30 is at substantially the equivalent of a 55 dB SPL input level. Speech signals at or below the 55 dB SPL level, are provided with unitary gain, whereby substantially all speech signal levels to automatic gain control unit 16 emerge from amplifier 30 at a substantially uniform long-time average level. By automatically controlling the speech signal level in steps, as described above, a wide range of speech signals levels may be controlled with minimum distortion. Both automatic gain control sections 18 and 20 in automatic gain control unit 16 have fast attack and slow release time constants. For example, only, and not by way of limitation, they may have attack time constants of, say, 0.01 sec., and release time constants of, say, 0.4 sec.

The substantially uniform level signal from automatic gain control unit 16 is supplied to noise suppressor unit 40 where segments of the signal comprising only background noise are suppressed whereas segments which include speech are passed to the output therefrom. Noise suppressor unit 40 is shown to comprise an automatic gain control amplifier 42 and an agc control unit 44 to which the output from automtic gain control unit 16 is supplied. A threshold voltage above which the control unit 44 operates is supplied by voltage source V connected to control unit 44 through a potentiometer 46.

The threshold voltage for control unit 44 is set for noise suppression, or squelch action, at a level that is below the effective specified level for automatic gain control action by automatic gain control unit 16. For example only, and not by way of limitation, the threshold for unit 40 may be set at, say, 12 dB below the threshold settings of automatic gain control sections 18 and 20, for operation at the equivalent of approximately 43 dB acoustic SPL at the microphone. The agc control unit 44 includes attack and release time control circuits to provide the noise suppressor unit with long attack and short release time constants of, say, 0.4 sec and 0.01 sec, respectively.

With the above threshold settings and attack and release time constants, it will be seen that when the signal continuum after automatic gain control processing at unit 16 is above the squelch threshold for periods longer than approximately 0.4 secs. the squelch action is activated, and when the signal continuum is below the squelch threshold for a few milliseconds, the squelch action is stopped. As a result, speech segments, which typically vary over at least a 12 dB range within periods shorter than approximately 0.4 seconds, pass through noise suppressor unit 40 without being squelched, whereas background noise signal segments which typically have a more steady level for more than approximately 0.4 sec. will be squelched.

The output from noise suppressor unit 40 is amplified by an adjustable gain amplifier 50, and the amplified output is supplied to an earphone, loudspeaker, or like transducer, 52 for conversion of the electrical signal back to sound.

Although the operation of the system is believed to be apparent from the above description, a brief description thereof now will be provided. Audio speech signals, together with background noise signals, at the output from microphone 10 are amplified and filtered at amplifier 12 and band-pass filter 14, respectively. Automatic gain control means 16 serves to hold the amplitude of the signal at a substantially constant long-time average level. If desired, a conventional automatic gain control circuit having short attack and long release time constants may be employed for this purpose.

For operation over a wide dynamic range of input signals, the novel two-stage automatic gain control unit 16 may be employed wherein one stage 18 serves to amplify those background noise and background noise plus speech signals which are below a predetermined level to raise the same to a substantially constant level of, say, 55 dB SPL equivalent at microphone 10. Then, at stage 20, those speech signals that are above the 55 dB level are reduced in amplitude to the 55 dB level. Fast attack, slow release time constant circuits are included in agc control units 24 and 32 of sections 18 and 20, and the threshold level at which the automatic gain control sections operate is established by settings of potentiometers 26 and 34, respectively.

The substantially constant long-time average signal from automatic gain control unit 16 is supplied to noise suppressor unit 40 for suppression of background noise signals from between speech signal segments. This operation involves use of an agc control unit 44 having a threshold which is set below the long-time average signal level supplied thereto from automatic gain control unit 16. Also, circuit components of control unit 44 provide the unit with long attack and short time constants on the order of, say, 0.4 and 0.01 seconds, respectively. As a result, when the signal continuum at the input to noise suppressor 40 is above the squelch threshold for periods longer than about 0.4 seconds, the squelch action is initiated. Consequently background noise signals unaccompanied by speech signals are squelched. Speech signals are not subject to the squelch action since they typically vary over a 12 dB, or greater, range without periods shorter than the 0.4 second attack time constant of unit 44. Since typical speech signals do not initiate the squelch action, they pass through amplifier 42 without attenuation.

As is well understood, hearing losses often occur to greater degrees in some frequency regions than in other regions for different people. Therefor, in some cases different degrees of amplification for different sound frequency regions can better aid speech understanding than is possible with a uniform amplification of all frequencies. Also, it will be understood that different noises in the environment that interfere with speech communication can have widely different spectra, some can be predominately low, middle or high frequency in context. For these reasons, a more useful hearing aid may sometimes be achieved by filtering the signal input into different frequency bands and treating separately each band in the manner shown in FIG. 1 and described above. That is, each frequency band may be subjected to automatic gain control and speech-noise discrimination actions separately before combining the outputs from each frequency band for presentation to the listener.

Reference now is made to FIG. 2 wherein a multi-band system is shown which, for purposes of illustration, includes two frequency bands. The output from pick-up means 10 is amplified at amplifier 12, and the amplifier output is supplied to a plurality of band-pass filters 14A and 14B having different pass bands of, say, 200-3,000 Hz and 3,000-6,000 Hz, respectively. The different frequency band signals are supplied to automatic gain control units 16A and 16B for amplitude control of the signals. If desired automatic gain control units which include a plurality of control units with separate attack and release time constant circuit elements and threshold circuits, such as automatic gain control unit 16 shown in FIG. 1 and described above may be used for automatic gain control operation over a wide amplitude of input signals thereto.

From automatic gain control units 16A and 16B, the signals are supplied to noise suppressor units 40A and 40B, respectively, where noise signals between speech signal segments are squelched. Again, noise suppressor unit 40A and 40B may be of the same type as noise suppressor unit 40 shown in FIG. 1 and described above. The thresholds at which the individual noise suppressor units operate are adjustable, as with unit 40. Outputs from noise suppressor units 40A and 40B are amplified by adjustable gain amplifiers 50A and 50B, and the amplified outputs are supplied to an adjustable gain summing amplifier 60 where signals from the individual channels are combined. The combined output is supplied to transducer 52, such as an earphone, for conversion to sound energy.

Threshold signal control may, for example, be of the Field Effect Transistor (FET) type; such as described in "Electronic Principles" by Malvino, McGraw-Hill, New York, 1973; and attack and release time control circuits may be of the operational amplifier type with appropriate capacitive and resistive feedback elements as described in the same publication. Obviously, other types of well known circuits may be similarly employed.

Also, it will be apparent that the invention is not limited to the attack and release time constants mentioned above for purposes of description. For example, these time constants may be selected dependent upon existing, or prevalent, speech and noise conditions. The nominal 12 dB differential between the thresholds for automatic gain control and squelch actions, which is adjustable, may be adjusted according to the users desire to listen to different degrees of speech-to-noise ratios under given circumstances. For example, decreasing this differential allows for hearing of noise plus speech (lower speech-to-noise ratios) present at the input to the system which at times may be deemed appropriate. Adjusting the system for operation at greater automatic gain control-squelch threshold differentials would allow for hearing of only those segments of the signal continuum that consist of speech segments that are relatively free of noise at the input.

In addition, it will be apparent that systems having more than the two signal passbands illustrated in FIG. 2 may be employed. Obviously, inputs for the AGC control units 24, 32 and 44 may be obtained from either the input or output of the associated automatic gain control amplifier 22, 30, and 42, respectivey. Also, automatic gain control amplifier 42 in the noise suppression unit 40 simply may comprise an analog switch which is non-conductive between speech signal segments. It is intended that the above and other such changes and modifications which suggest themselves to those skilled in this art shall fall within the spirit and scope of the invention defined in the appended claims.

I claim:

1. A method of aiding hearing by reducing the level of background noise signals between speech signal segments of an input signal, comprising
   reducing the long-time average intensity level of input signal segments that are above a predetermined long-time average level with substantially linear gain over a predetermined range of short-time averaged level segments of the input signal,
   amplifying those long-time averaged segments of the input signal that are not reduced in level to increase the long-time averaged level thereof to said predetermined long-time averaged level,
   following the above adjustments to temporal segments of the input signal, reducing the signal level when the long-timed averaged level segments thereof exceed a predetermined level below said predetermined long-time average level for reducing the level of background noise signals between speech signal segments.

2. A method as defined in claim 1 wherein the input signals are split into a plurality of frequency bands and fed along individual paths along which the steps recited in claiim 1 are performed, and
   combining outputs from the individual paths for presentation to an output.

3. A method as defined in claim 2 wherein independent level adjustments are effected in each path prior to said combining step.

4. Audio signal amplifying means for use in a hearing aid, or the like, comprising
   microphone pick-up means responsive to speech signals and background noise signals,
   fast attack and slow release automatic gain control means for amplifying output from the pick-up means and compressing speech signal segments included therein, said automatic gain control means including threshold level setting means for establishing the long-time average level of the signal output therefrom, and
   slow attack and fast release noise suppressor means responsive to the output from said automatic gain control means having a threshold level of operation below that of said automatic gain control means for passing speech signals and squelching background noise signals between segments of speech signals.

5. Audio signal amplifying means as defined in claim 4 wherein said automatic gain control means comprises a pair of automatic gain control sections in series circuit, one of which automatic gain control sections comprising means for amplifying signals which are below the threshold level of the automatic gain control means and the other of which automatic gain control sections comprises means for reducing the amplitude of signals which are above said threshold level of the automatic gain control means.

6. Audio signal amplifying means as defined in claim 5 wherein said pair of automatic gain control sections having substantially equal attack time constants and substantially equal release time constants.

7. Audio signal amplifying means as defined in claim 4 wherein the attack time constant of said automatic gain control means is substantially equal to the release time constant of said noise suppressor means.

8. Audio signal amplifying means as defined in claim 4 wherein the release time constant of said automatic gain control means is substantially equal to the attack time constant of said noise suppressor means.

9. Audio signal amplifying means as defined in claim 8 wherein the attack time constant of said automatic gain control means is substantially equal to the release time constant of said noise suppressor means.

10. Audio signal amplifying means as defined in claim 8 wherein the release time constant of said automatic gain control means and attack time constant of said noise suppressor means are in the range of 0.3 to 0.5 seconds.

11. Audio signal amplifying means as defined in claim 4 including band-pass filter means having a passband in the speech signal range for passing speech signals from the pick-up means to said automatic gain control means.

12. Audio signal amplifying means as defined in claim 4 including band-pass filter means for dividing the output from the pick-up means into a plurality of adjacent narrow frequency bands within the speech signal frequency band,
    said automatic gain control means including a plurality of automatic gain control units, one connected to each of the bandpass filter means,
    said noise suppressor means comprising a plurality of noise suppressor units, one connected to each of the automatic gain control units, and
    means for combining signals from the noise suppressor units.

13. Audio signal amplifying means for speech signals for use in a hearing aid, or the like, comprising
    first automatic gain control means responsive to input signals in the speech signal range and having a linear gain characteristic with input signals above a long-time average threshold level, with input signals below said threshold level the gain of said first automatic gain control means being increased to raise the signal to said threshold level, and
    second automatic gain control means responsive to the output from said first automatic gain control means and having a linear gain characteristic for input signals below said long-time average threshold level, with input signals above said threshold level the gain of said second automatic gain control means being reduced to reduce the signal to said threshold level.

14. Audio signal amplifying means as defined in claim 13 including noise suppressor means responsive to the output from said second automatic gain control means, said noise suppressor means having slow attack and fast release time constants and a threshold level below that of said first and second automatic gain control means for squelching background noise signals between speech signal segments at the input to the first automatic gain control means.

* * * * *